(12) United States Patent
Hsu et al.

(10) Patent No.: US 12,224,339 B2
(45) Date of Patent: Feb. 11, 2025

(54) HIGH ELECTRON MOBILITY TRANSISTOR

(71) Applicant: UNITED MICROELECTRONICS CORP., Hsin-Chu (TW)

(72) Inventors: Yu-Ming Hsu, Changhua County (TW); Yu-Chi Wang, Taipei (TW); Yen-Hsing Chen, Taipei (TW); Tsung-Mu Yang, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 437 days.

(21) Appl. No.: 17/735,100

(22) Filed: May 2, 2022

(65) Prior Publication Data

US 2022/0262942 A1 Aug. 18, 2022

Related U.S. Application Data

(62) Division of application No. 16/574,094, filed on Sep. 18, 2019, now Pat. No. 11,355,626.

(30) Foreign Application Priority Data

Aug. 26, 2019 (CN) .......................... 201910788603.5

(51) Int. Cl.
*H01L 29/778* (2006.01)
*H01L 29/04* (2006.01)
(Continued)

(52) U.S. Cl.
CPC ........ *H01L 29/7787* (2013.01); *H01L 29/155* (2013.01); *H01L 29/2003* (2013.01);
(Continued)

(58) Field of Classification Search
CPC .............. H01L 29/7787; H01L 29/155; H01L 29/2003; H01L 29/205; H01L 29/267;
(Continued)

(56) References Cited

U.S. PATENT DOCUMENTS 9,443,969 B2 9/2016 Wong
2006/0202272 A1 9/2006 Wu
(Continued)

FOREIGN PATENT DOCUMENTS

CN 1906765 A 1/2007
CN 1910737 A 2/2007
(Continued)

OTHER PUBLICATIONS

Derwent Abstract of CN10377409 (Year: 2014).*
(Continued)

*Primary Examiner* — Julia Slutsker
(74) *Attorney, Agent, or Firm* — Winston Hsu

(57) ABSTRACT

An HEMT includes an aluminum gallium nitride layer. A gallium nitride layer is disposed below the aluminum gallium nitride layer. A zinc oxide layer is disposed under the gallium nitride layer. A source electrode and a drain electrode are disposed on the aluminum gallium nitride layer. A gate electrode is disposed on the aluminum gallium nitride layer and between the drain electrode and the source electrode.

7 Claims, 3 Drawing Sheets

(51) Int. Cl.
  *H01L 29/15*  (2006.01)
  *H01L 29/20*  (2006.01)
  *H01L 29/205* (2006.01)
  *H01L 29/267* (2006.01)

(52) U.S. Cl.
  CPC .......... *H01L 29/205* (2013.01); *H01L 29/267* (2013.01); *H01L 29/04* (2013.01)

(58) Field of Classification Search
  CPC . H01L 29/04; H01L 29/7786; H01L 29/1066; H01L 29/42316
  See application file for complete search history.

(56) References Cited

U.S. PATENT DOCUMENTS

2011/0006346 A1   1/2011   Ando
2016/0211330 A1   7/2016   Li

FOREIGN PATENT DOCUMENTS

CN    103779409 A  *  5/2014  ....... H01L 29/66462
JP    2016-62968 A    4/2016

OTHER PUBLICATIONS

Machine Translation of claims CN10377409 (Year: 2014).*
Machine Translation of CN103779409 (Year: 2014).*
Chiou, "AlGaN/GaN MOS-HEMTs with ZnO Gate Insulator and Chlorine Surface Treatment", 2010 IEEE International Systems Conference, Publication Year: 2010, pp. 1222-1224.
Ellinghaus, "Simulation of GaN/AlGaN heterostructures for a HEMT simulator", Master Thesis in Mathematical Engineering of University of L'Aquila, 2011.
Ambacher, "Two-dimensional electron gases induced by spontaneous and piezoelectric polarization charges in N- and Ga-face AlGaN/GaN heterostructures", Journal of Applied Physics, vol. 85, No. 6, Mar. 15, 1999.

* cited by examiner

HIGH ELECTRON MOBILITY TRANSISTOR

CROSS REFERENCE TO RELATED APPLICATIONS

This application is a division of U.S. application Ser. No. 16/574,094, filed on Sep. 18, 2019. The content of the application is incorporated herein by reference.

BACKGROUND OF THE INVENTION

1. Field of the Invention

The present invention relates to a high electron mobility transistor (HEMT). In particular, the present invention relates to an HEMT with zinc oxide or magnesium oxide disposed under a channel layer.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride (GaN) based materials have been applied in high power and high frequency products because of their properties of wider bandgap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

However, after two different III-V semiconductor compounds contact each other, a direction of piezoelectric polarization of the III-V semiconductor compound having greater lattice size decreases the current density of the 2DEG.

SUMMARY OF THE INVENTION

In light of the above, the present invention provides an HEMT with zinc oxide or magnesium oxide therein to adjust the direction of piezoelectric polarization of the III-V semiconductor compound.

According to a preferred embodiment of the present invention, a high electron mobility transistor (HEMT) includes an aluminum gallium nitride layer. A gallium nitride layer is disposed below the aluminum gallium nitride layer. A zinc oxide layer is disposed under the gallium nitride layer. A source electrode and a drain electrode are disposed on the aluminum gallium nitride layer. Finally, a gate electrode is disposed on the aluminum gallium nitride layer and between the drain electrode and the source electrode.

According to another preferred embodiment of the present invention, a high electron mobility transistor (HEMT) includes an aluminum gallium nitride layer. A gallium nitride layer is disposed below the aluminum gallium nitride layer. A magnesium oxide layer is disposed under the gallium nitride layer. A source electrode and a drain electrode are disposed on the aluminum gallium nitride layer. A gate electrode is disposed on the aluminum gallium nitride layer and between the drain electrode and the source electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
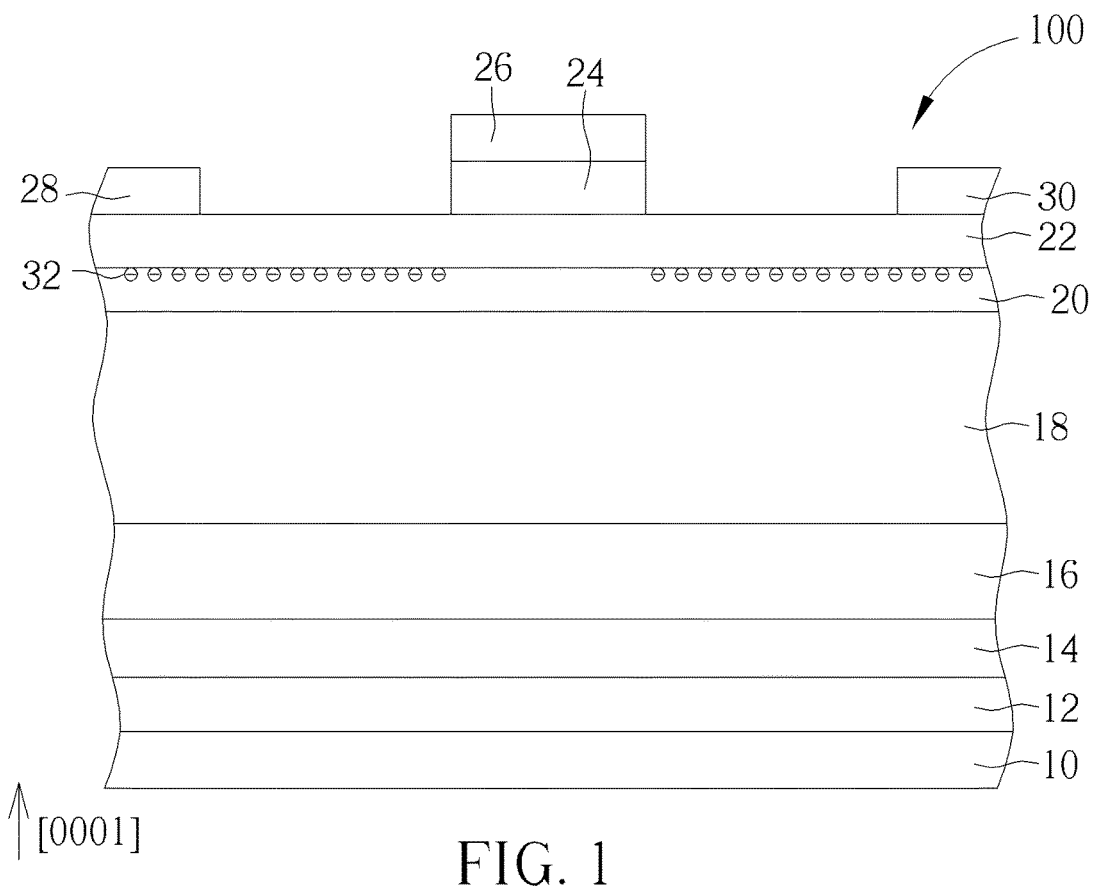
FIG. 1 depicts an HEMT according to a first preferred embodiment of the present invention.

FIG. 1 depicts an HEMT according to a first preferred embodiment of the present invention.

As shown in FIG. 1, an HEMT 100 includes a substrate 10. The substrate 10 may be a silicon substrate. A nucleation layer 12 is disposed on the silicon substrate 10. A transition layer 14 is disposed on the nucleation layer 12. A superlattice 16 is disposed on the transition layer 14. A zinc oxide layer 18 is disposed on the superlattice 16. A gallium nitride (GaN) layer 20 is disposed on the zinc oxide layer 18, and the gallium nitride layer 20 contacts the zinc oxide layer 18. An aluminum gallium nitride ($Al_xGa_{1-x}N$) layer 22 is disposed on the gallium nitride layer 20 and the aluminum gallium nitride layer 22 contacts the gallium nitride layer 20. A P-type gallium nitride layer 24 is disposed on the aluminum gallium nitride layer 22. A gate electrode 26 is disposed on the P-type gallium nitride layer 24. A source electrode 28 and a drain electrode 30 are disposed on the aluminum gallium nitride layer 22 and between the source electrode 28 and the drain electrode 30.

The gallium nitride layer 20 serves as a channel layer. A two-dimensional electron gas (2DEG) 32 generates in the gallium nitride layer 20 closed to the aluminum gallium nitride layer 22. When the HEMT 100 tunes off, there is no 2DEG 32 directly below the P-type gallium nitride layer 24. That is, the HEMT 100 is a normally-off transistor. The gate electrode 26, the drain electrode 30 and the source electrode 28 may be titanium, aluminum, titanium nitride or other conductive materials.

The substrate 10 may be doped by P-type dopants such as boron, aluminum, gallium or indium. The nucleation layer 12, the transition layer 14 and the superlattice 16 can be used to transition the lattice mismatch between the substrate 10 to zinc oxide layer 18. The nucleation layer 12, the transition layer 14 and the superlattice 18 may be a multiple-layer material. Moreover, the nucleation layer 12, the transition layer 14 and the superlattice 16 may be doped with P-type dopants. The P-type dopants can trap the electrons diffusing from the substrate 10 so as to prevent the 2DEG 32 from being influenced by the electrons. The nucleation layer 12, the transition layer 14 and the superlattice 16 includes aluminum nitride, aluminum gallium nitride or a combination thereof. According to a preferred embodiment of the present invention, the nucleation layer 12 is aluminum nitride. The transition layer 14 is aluminum gallium nitride. The superlattice 16 is formed by stacking aluminum nitride and aluminum gallium nitride alternately and repeatedly. The aluminum concentration of the aluminum gallium nitride in the transition layer 14 and the superlattice 16 may be the same as or different from each other.

According to a preferred embodiment of the present invention, a thickness of the zinc oxide layer 18 is 5 to 10 times greater than a thickness of the gallium nitride layer 20. However, the thickness of the zinc oxide layer 18 and the thickness of the gallium nitride layer 20 can be altered based on different requirements. Moreover, the gallium nitride layer 20 is Ga-polarity. The direction [0001] of a Wurtzite hexagonal structure of the gallium nitride layer 20 is perpendicular to a top surface of the substrate 10.

Figure 3:
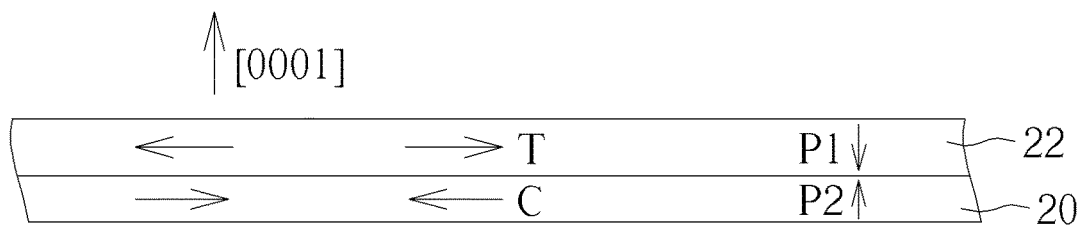
FIG. 3 depicts directions of piezoelectric polarization of a gallium nitride layer and an aluminum gallium nitride layer.

FIG. 3 depicts directions of piezoelectric polarization of a gallium nitride layer and an aluminum gallium nitride layer, wherein elements which are substantially the same as those in the first preferred embodiment are denoted by the same reference numerals; an accompanying explanation is therefore omitted.

As shown in FIG. 3, the gallium nitride layer 20 is Ga-polarity. The direction [0001] of the Wurtzite hexagonal structure of the gallium nitride layer 20 is perpendicular to the top surface of the substrate 10. On the occasion of the bottom of the gallium nitride layer 20 does not contact the zinc oxide layer 18 and the aluminum gallium nitride layer 22 is stacked on the gallium nitride layer 20, the gallium nitride layer 20 contains compressive stress C and the aluminum gallium nitride layer 22 contains tensile stress T. At this point, the direction of piezoelectric polarization P2 of the gallium nitride layer 20 and the direction of piezoelectric polarization P1 of the aluminum gallium nitride layer 22 are opposite. In detail, the direction of piezoelectric polarization P2 is the same as the direction [0001]. The direction of piezoelectric polarization P1 is opposite to the direction [0001]. The direction of piezoelectric polarization P2 decreases the current density of the 2DEG 32.

Figure 4:
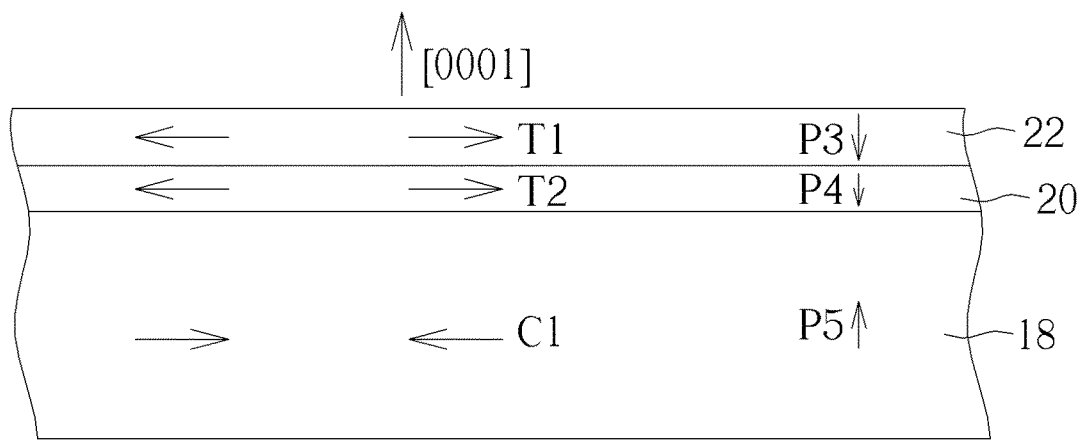
FIG. 4 depicts directions of piezoelectric polarization of a gallium nitride layer, an aluminum gallium nitride layer and a zinc oxide layer in FIG. 1.

FIG. 4 depicts directions of piezoelectric polarization of a gallium nitride layer, an aluminum gallium nitride layer and a zinc oxide layer in FIG. 1, wherein elements which are substantially the same as those in the first preferred embodiment are denoted by the same reference numerals; an accompanying explanation is therefore omitted.

As shown in FIG. 4, the gallium nitride layer 20 is Ga-polarity. The direction [0001] of the Wurtzite hexagonal structure of the gallium nitride layer 20 is perpendicular to the top surface of the substrate 10. When the zinc oxide layer 18 is disposed below and contacts the gallium nitride layer 20 and the aluminum gallium nitride layer 22 is stacked on the gallium nitride layer 20, the gallium nitride layer 20 contains tensile stress T2, the aluminum gallium nitride layer 22 contains tensile stress T1 and the zinc oxide layer 18 contains compressive stress C1. At this point, the direction of piezoelectric polarization P4 of the gallium nitride layer 20 and the direction of piezoelectric polarization P3 of the aluminum gallium nitride layer 22 are same. The direction of piezoelectric polarization P5 of the zinc oxide layer 18 and the direction of piezoelectric polarization P3 of the aluminum gallium nitride layer 22 are opposite. In detail, the direction of piezoelectric polarization P5 is the same as the direction [0001]. Both of the direction of piezoelectric polarization P3 and the direction of piezoelectric polarization P4 are opposite to the direction [0001]. In other words, both of the piezoelectric polarization P3 and the piezoelectric polarization P4 point to the zinc oxide layer 18. Because the direction of piezoelectric polarization P3 is the same as the direction of piezoelectric polarization P4, the current density of the 2DEG 32 is increased.

Figure 2:
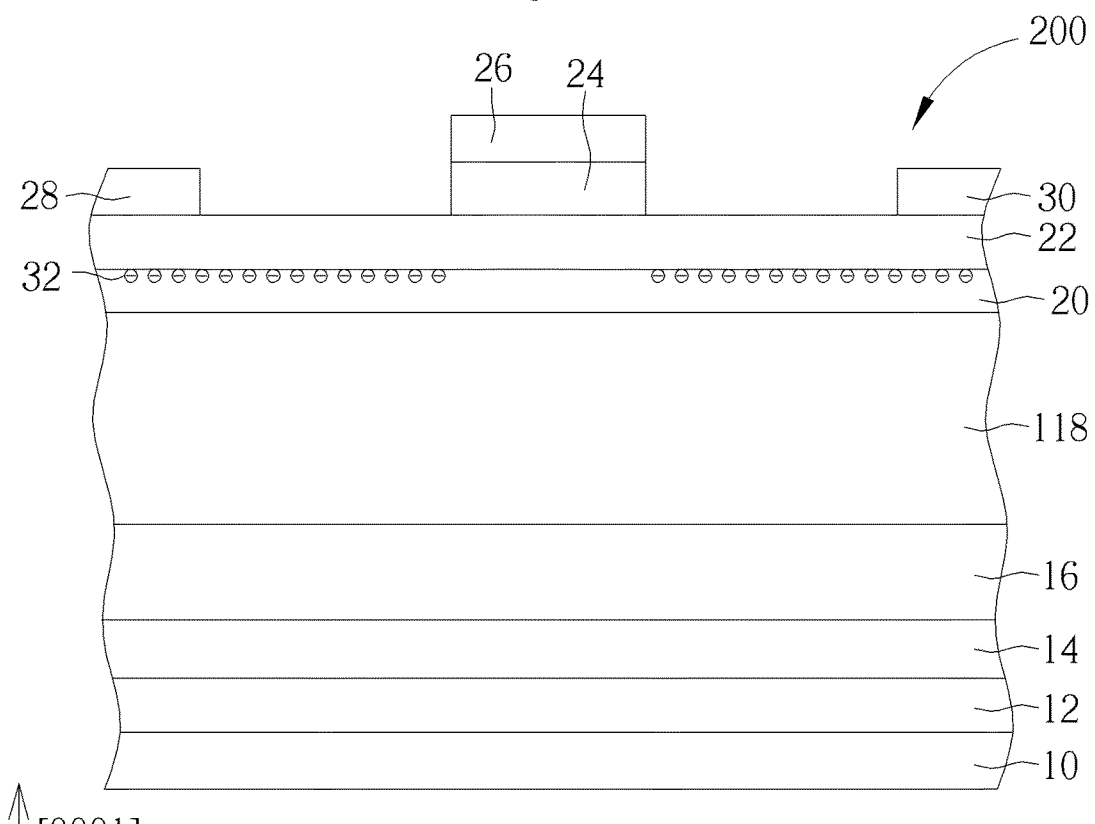
FIG. 2 depicts an HEMT according to a second preferred embodiment of the present invention.

FIG. 2 depicts an HEMT according to a second preferred embodiment of the present invention, wherein elements which are substantially the same as those in the first preferred embodiment are denoted by the same reference numerals; an accompanying explanation is therefore omitted.

As shown in FIG. 2, the HEMT 200 has a magnesium oxide layer 118 disposed under the gallium nitride layer 20. The magnesium oxide layer 118 contacts the gallium nitride layer 20. The thickness of the magnesium oxide layer 118 is 5 to 10 times greater than the thickness of the gallium nitride layer 20. However, the thickness of the magnesium oxide layer 118 and the thickness of the gallium nitride layer 20 can be altered based on different requirements.

Figure 5:
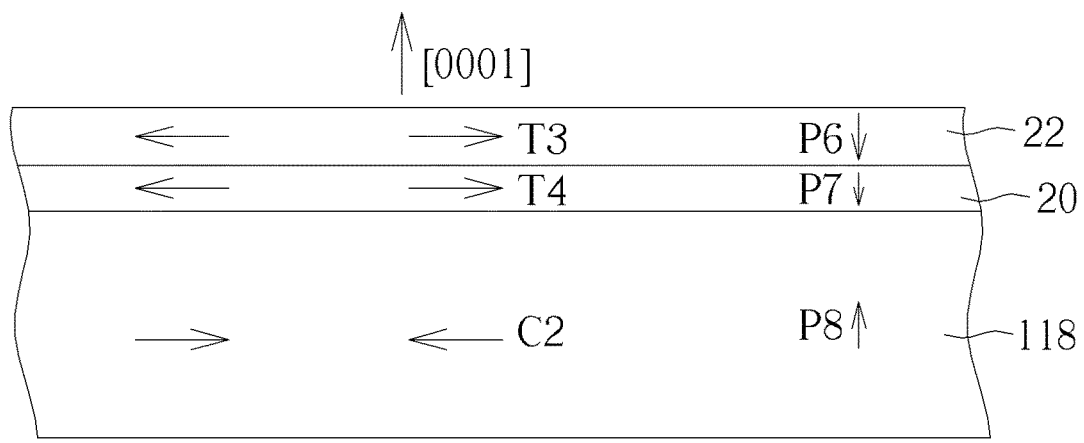
FIG. 5 depicts directions of piezoelectric polarization of a gallium nitride layer, an aluminum gallium nitride layer and a magnesium oxide layer in FIG. 2.

FIG. 5 depicts directions of piezoelectric polarization of a gallium nitride layer, an aluminum gallium nitride layer and a magnesium oxide layer in FIG. 2, wherein elements which are substantially the same as those in the second preferred embodiment are denoted by the same reference numerals; an accompanying explanation is therefore omitted.

As shown in FIG. 5, the gallium nitride layer 20 is Ga-polarity. The direction [0001] of the Wurtzite hexagonal structure of the gallium nitride layer 20 is perpendicular to the top surface of the substrate 10. Similar to the case in FIG. 4, when the magnesium oxide layer 118 is disposed below and contacts the gallium nitride layer 20 and the aluminum gallium nitride layer 22 is stacked on the gallium nitride layer 20, the gallium nitride layer 20 contains tensile stress T3, the aluminum gallium nitride layer 22 contains tensile stress T4 and the magnesium oxide layer 118 contains compressive stress C2. At this point, the direction of piezoelectric polarization P7 of the gallium nitride layer 20 and the direction of piezoelectric polarization P6 of the aluminum gallium nitride layer 22 are same. The direction of piezoelectric polarization P8 of the magnesium oxide layer 118 and the direction of piezoelectric polarization P6 of the aluminum gallium nitride layer 22 are opposite. In detail, the direction of piezoelectric polarization P8 is the same as the direction.

Both of the direction of piezoelectric polarization P6 and the direction of piezoelectric polarization P7 are opposite to the direction [0001]. In other words, both of the piezoelectric polarization P6 and the piezoelectric polarization P7 point to the magnesium oxide layer 118. Because the direction of piezoelectric polarization P6 is the same as the direction of piezoelectric polarization P7, the current density of the 2DEG 32 is increased.

Figure 6:
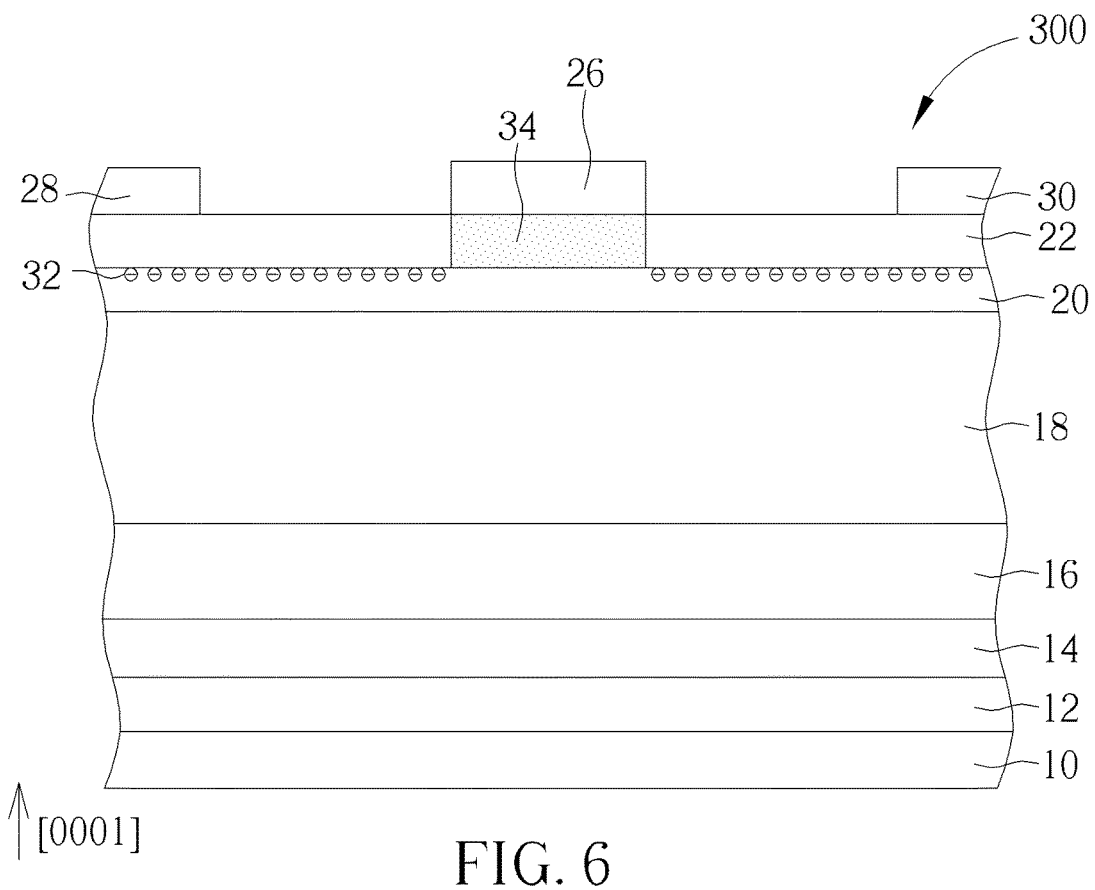
FIG. 6 depicts an HEMT according to a third preferred embodiment of the present invention.
Figure 7:
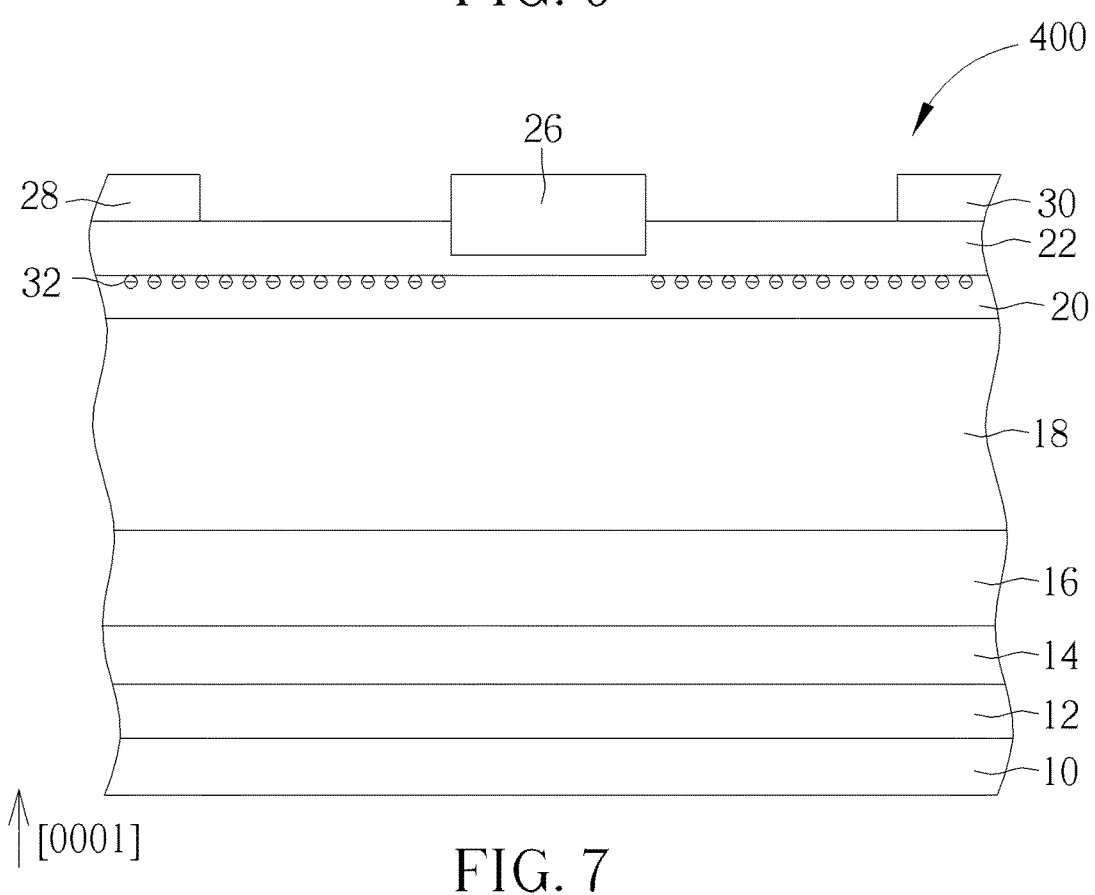
FIG. 7 depicts an HEMT according to a fourth preferred embodiment of the present invention.

FIG. 6 depicts an HEMT according to a third preferred embodiment of the present invention. FIG. 7 depicts an HEMT according to a fourth preferred embodiment of the present invention, wherein elements in FIG. 6 and FIG. 7 which are substantially the same as those in the first preferred embodiment are denoted by the same reference numerals; an accompanying explanation is therefore omitted.

As shown in FIG. 6 and FIG. 7, the zinc oxide layer 18 or the magnesium oxide layer 118 can not only be used in the HEMTs 100/200 with P-type gallium nitride layer 24, but also can be utilized in the HEMT 300 with fluorine-doped region 34 in the aluminum gallium nitride layer 22 or the HEMT 400 with the gate electrode 26 recessed in the aluminum gallium nitride layer 22. The HEMT 300 and the HEMT 400 are both normally-off transistors. The embodiments in FIG. 6 and FIG. 7 take the zinc oxide layer 18 as an example. However, based on different requirements, the zinc oxide layer 18 can be replaced by the magnesium oxide layer 118.

The zinc oxide layer or the magnesium oxide layer of present invention is specially disposed under and contacts the gallium nitride layer. Because the lattice constant of zinc oxide and the lattice constant of magnesium oxide are both larger than that of gallium nitride, the gallium nitride layer contacting the zinc oxide layer or contacting the magnesium oxide layer generates tensile stress. Comparing to the situation in FIG. 3, the zinc oxide layer and the magnesium oxide layer respectively in the first preferred and the second preferred embodiment can change the direction of piezoelectric polarization of the gallium nitride layer and therefore increase the current density of the 2DEG. Moreover, the band gap of zinc oxide and the band gap of magnesium oxide are higher than the band gap of gallium nitride; therefore the HEMT with the zinc oxide layer or the magnesium oxide layer has a higher breakdown voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   an aluminum gallium nitride layer;
   a gallium nitride layer disposed below the aluminum gallium nitride layer;
   a magnesium oxide layer disposed under the gallium nitride layer;
   a source electrode and a drain electrode disposed on the aluminum gallium nitride layer;
   a gate electrode disposed on the aluminum gallium nitride layer and between the drain electrode and the source electrode; and
   a substrate, a nucleation layer, a transition layer and a superlattice disposed below the magnesium oxide layer, wherein the substrate, the nucleation layer, the transition layer and the superlattice are disposed from bottom to top.

2. The HEMT of claim 1, wherein the magnesium oxide layer directly contacts the gallium nitride layer.

3. The HEMT of claim 1, wherein a thickness of the magnesium oxide layer is 5 to 10 times greater than a thickness of the gallium nitride layer.

4. The HEMT of claim 1, wherein the gallium nitride layer contains tensile stress.

5. The HEMT of claim 1, wherein the aluminum gallium nitride layer contains tensile stress.

6. The HEMT of claim 1, wherein the nucleation layer, the transition layer and the superlattice independently comprise aluminum nitride, aluminum gallium nitride or a combination of aluminum nitride and aluminum gallium nitride.

7. The HEMT of claim 1, wherein a direction of piezoelectric polarization of the gallium nitride layer is in a direction toward the magnesium oxide layer.

* * * * *